(12) United States Patent
Ding

(10) Patent No.: US 6,828,687 B2
(45) Date of Patent: Dec. 7, 2004

(54) CAVITY DOWN BALL GRID ARRAY PACKAGE STRUCTURE AND CARRIER THEREOF

(75) Inventor: Yi-Chuan Ding, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/250,006

(22) Filed: May 28, 2003

(65) Prior Publication Data
US 2004/0032022 A1 Feb. 19, 2004

(30) Foreign Application Priority Data
Aug. 16, 2002 (TW) ........................................ 91118508 A

(51) Int. Cl.[7] .............................................. H01L 23/48
(52) U.S. Cl. ..................... 257/778; 257/680; 257/706; 257/782; 257/783; 257/796
(58) Field of Search ................................. 257/680, 706, 257/778, 782, 783, 796

(56) References Cited

U.S. PATENT DOCUMENTS 5,977,633 A * 11/1999 Suzuki et al. ............... 257/738
6,469,897 B2 * 10/2002 Ho et al. ..................... 361/704
2002/0195721 A1 * 12/2002 Lee et al. .................... 257/780
2004/0051172 A1 * 3/2004 Miyazaki et al. ........... 257/706

FOREIGN PATENT DOCUMENTS

JP         2001144203 A  *  5/2001    ........... H01L/23/12

* cited by examiner

*Primary Examiner*—Tom Thomas
*Assistant Examiner*—Matthew E. Warren
(74) *Attorney, Agent, or Firm*—Jiang Chyun IP Office

(57) ABSTRACT

A cavity down ball grid array package having a heat spreader, a substrate, a die, a plurality of conductive wires, a capsulation and a plurality of solder balls. The substrate has a first surface and a second surface. The first surface of the substrate is attached to the heat spreader. The substrate has a through hole that passes through the substrate and exposes the heat spreader. The substrate and the heat spreader are electrically connected. The die has a plurality of bonding pads on the active surface. The back surface of the die is attached to the heat spreader inside the through hole. One end of each conductive wire is electrically connected to a bonding pad while the other end of the conductive wire is electrically connected to the substrate. The encapsulation fills the through hole and encloses the die and the conductive wires. The solder balls are attached to the second surface of the substrate.

14 Claims, 2 Drawing Sheets

CAVITY DOWN BALL GRID ARRAY PACKAGE STRUCTURE AND CARRIER THEREOF

CROSS REFERENCE TO RELATED APPLICATIONS

This application claims the priority benefit of Taiwan application serial no. 91118508, filed Aug. 16, 2002.

BACKGROUND OF INVENTION

1. Field of Invention

The present invention relates to a cavity down ball grid array package structure. More particularly, the present invention relates to a cavity down ball grid array package capable of boosting electrical performance and lowering noise interference.

2. Description of Related Art

As techniques for manufacturing semiconductor devices continue to improve, high-tech electronic products are produced. Electronic products with personalized functions are appearing every day. Most electronic products are now designed to occupy as little space and weigh as little as possible. Yet, the products must be easy to use and feel comfortable. To fabricate a product with all the necessary functions and characteristic properties, the way the product is packaged is very important. Electronic devices are often packaged together inside a dual-in-line package (DIP), a ball grid array (BGA) or a tape automated bonding (TAB). In general, each packaging type has its special characteristics.

Among the conventional types of electronic packages, ball grid array (BGA) is most common. A back of a die is attached to the bonding pad on a substrate using an adhesive tape or other nonconductive adhesive materials. The bonding pads on the die and the contact points on the substrate are electrically connected using conductive wires. An encapsulation encloses the die, the conductive wires, and the contacts. In addition, a plurality of solder balls is planted onto the ball pads on the substrate so that the ball grid array may transmit electrical signals to the external circuit through the solder balls. Since the circuit layout on the BGA package is arranged in the form of an array, the package can accommodate a large number of external contacts.

However, as the size of each die shrinks, the level of integration increases correspondingly so that the amount of heat generated per unit area while the devices are working also increases proportionately. Hence, cooling is also an important consideration for the package designer. In general, a cavity down ball grid array (CDBGA) has a high heat dissipation capacity because the backside of the die is directly attached to a heat spreader. Through the heat spreader, heat generated with the package is directly conducted to the exterior.

FIG. 1 is a schematic cross-sectional view of a conventional cavity down ball grid array package. As shown in FIG. 1, the cavity down ball grid array package 100 includes a heat spreader 110, a substrate 120, a die 160, a plurality of conductive wires 170, an encapsulation 180 and a plurality of solder balls 190. The substrate 120 has a first surface 122 and a second surface 124. The first surface 122 of the substrate 120 is attached to the heat spreader 110 through non-conductive glue 192. The substrate 120 is a stack that includes four metallic layers 132, 134, 136, 138 isolated from each other by alternately positioned insulating layers 142, 144 and 146 respectively. The substrate 120 has a plurality of through holes 126, 128 that pass through the substrate 120. The interior of the through hole 126 contains a metallic layer 131 that links up the four metallic layers 132, 134, 136 and 138 electrically. The through hole 128 is wide enough to enclose the die 160. The substrate 120 further includes two solder mask layers 152, 154 formed on the first surface 122 and the second surface 124 of the substrate 120 respectively. The solder mask layer 154 has a plurality of openings 156 that exposes a portion of the uppermost metallic layer 132, thereby forming a number of contacts 130 and 133. The contacts 133 surround the through hole 128. In general, the bottom most metallic layer 138 in the substrate 120 also includes a ground plate 139 that serves as an earth connection.

The die 160 has an active surface 162 and a back surface 164. The active surface 162 of the die 160 has a plurality of bonding pads 166. The back surface 164 of the die 160 is attached to the heat spreader 110 through an adhesion layer 194. One end of each conductive wire 170 is bonded to a contact pad 166 while the other end of the conductive wire 170 is bonded to the contact 133 on the substrate 120. The encapsulation 180 fills up the leftover space within the through hole 128 so that the die 160, the conductive wires 170 and the contact pads 133 are all enclosed. The solder balls 190 are attached to the contacts 130 on the substrate 120. Through the solder balls 190, the substrate 120 connects electrically with an external circuit (not shown).

In the aforementioned cavity down ball grid array package 100, the ground plate 139 must have a horizontal area smaller than the substrate 120. If the ground plate 139 is small, noise interference will increase correspondingly. Hence, when the horizontal area of the substrate 120 is reduced due to miniaturization, horizontal area of the ground plate 139 is bound to decrease and noise interference is likely to have a significant effect. In addition, the radiation generated by a radio frequency circuit is likely to increase noise production. Under such circumstance, any decrease in area of the ground plate 139 may lower the noise fighting capacity resulting in the production of several interfering noise sources. Ultimately, logic circuit operations within the die 160 are likely affected.

SUMMARY OF INVENTION

Accordingly, one object of the present invention is to provide a cavity down ball grid array package having an anti-noise interference capacity.

A second object of this invention is to provide a cavity down ball grid array package having superior heat dissipation capacity.

To achieve these and other advantages and in accordance with the purpose of the invention, as embodied and broadly described herein, the invention provides a cavity down ball grid array package. The package includes at least a heat spreader, a substrate, a die, a plurality of conductive wires, an encapsulation and a plurality of solder balls. The substrate has a first surface and a second surface. The first surface of the substrate is attached to the heat spreader. The substrate has a through hole that passes through the substrate and exposes the heat spreader. The substrate and the heat spreader are electrically connected. The die has an active surface and a back surface. The die has a plurality of bonding pads on the active surface. The back surface of the die is attached to the heat spreader inside the through hole. One end of each conductive wire is electrically connected to a bonding pad and the other end of the conductive wire is electrically connected to the substrate. The encapsulation fills the through hole and encloses the die and the conductive wires. The solder balls are attached to the second surface of the substrate.

According to one embodiment of this invention, the first surface of the substrate is attached to the heat spreader through conductive glue. The substrate comprises of a stack of alternately positioned metallic circuit structures and dielectric structures. The dielectric structures have at least an opening that exposes the metallic circuit structures. The conductive glue is applied to the opening so that the conductive glue connects electrically with one of the metallic circuit structures. The heat spreader is made from copper. In addition, a nickel layer is also formed on the surface of the heat spreader. Furthermore, the heat spreader and a ground terminal are electrically connected through the substrate. In other words, the substrate can include a first ground terminal. The heat spreader and the first ground terminal are electrically connected through the conductive glue fills. In addition, the die may also include a second ground terminal and the heat spreader and the second ground terminal are electrically connected through the conductive glue fills.

Alternatively, in the foregoing package, the first surface of the substrate can be attached to the heat spreader through conductive glue with the substrate comprising alternately positioned metallic circuit structures and dielectric structures. The dielectric structures has at least an opening that exposes one of the metallic circuit structures, and the conductive glue fills the opening and connects with the metallic circuit structures electrically.

Also and, in the foregoing package, the first surface of the substrate can be attached to the heat spreader through conductive glue with the substrate comprising alternately positioned metallic circuit structures and dielectric structures. The dielectric structure attached to the heat spreader has at least an opening that exposes one of the metallic circuit structures, and the conductive glue fills the opening and connects with the metallic circuit structures electrically.

In brief, the heat spreader is electrically connected to the bonding pads on the substrate so that the heat spreader may serve as a ground. Since the heat spreader has a horizontal area much greater than the total area provided by the die and the substrate, noise interfering sources are greatly reduced. Moreover, the back of the die is directly attached to the heat spreader through an adhesive layer so that heat generated by the die is quickly removed by conduction through the heat spreader. Hence, the package has an efficient cooling system.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
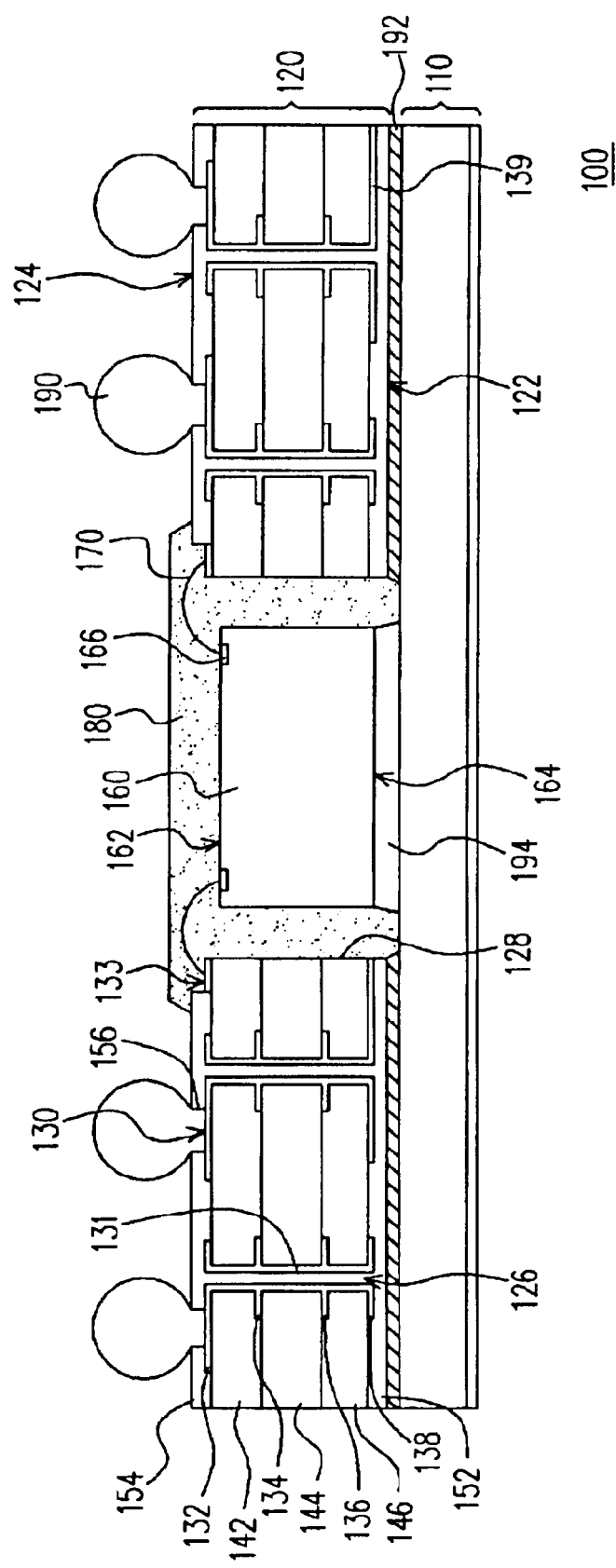
FIG. 1 is a schematic cross-sectional view of a conventional cavity down ball grid array package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
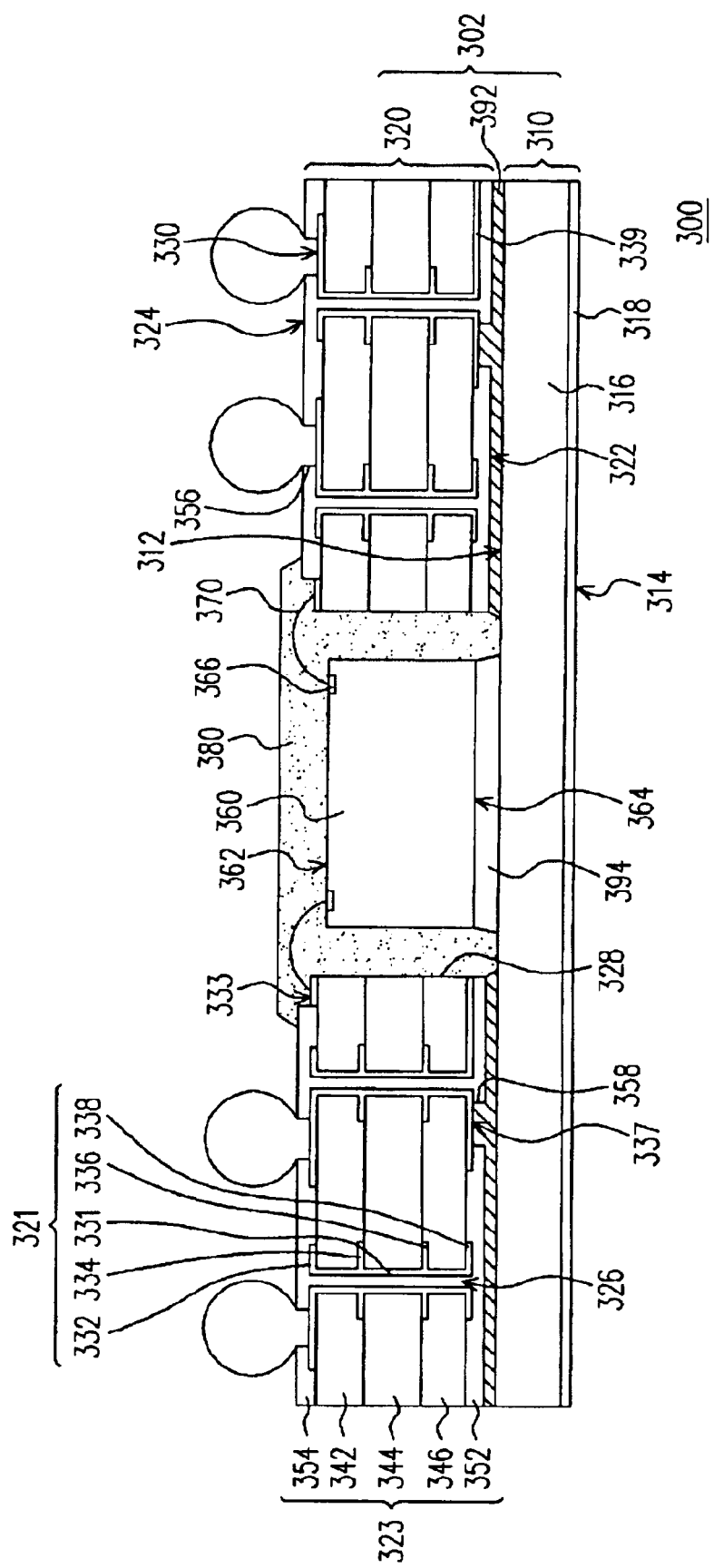
FIG. 2 is a schematic cross-sectional view of a cavity down ball grid array fabricated according to a first preferred embodiment of this invention.

FIG. 2 is a schematic cross-sectional view of a cavity down ball grid array fabricated according to a first preferred embodiment of this invention. As shown in FIG. 2, a cavity down ball grid array package 300 includes a heat spreader 310, a substrate 320, a die 360, a plurality of conductive wires 370, an encapsulation 380 and a plurality of solder balls 390. The heat spreader 310 is a flat plate having a first surface 312 and a second surface 314. The heat spreader 310 includes a main body 316 and a metallic layer 318 deposited on the second surface 314 of the heat spreader 310. The main body 316 is made from copper while the metallic layer is made from nickel, for example. The metallic layer 18 prevents the main body 316 from oxidation.

The substrate 320 also has a first surface 322 and a second surface 324. The first surface 322 of the substrate 320 is attached to the first surface 312 of the heat spreader 310 through conductive glue 392. The substrate 320 is a composite layer comprising four metallic layers 332, 334, 336, 338 and three dielectric layers 342, 344, 346 alternately positioned over each other. The substrate 320 has a plurality of through holes 326, 328 that pass through the substrate 320. The interior of the through hole 326 is coated with a metallic layer 331 so that the four metallic layers 332, 334, 336, 338 are electrically connected to each other. The through hole 328 is wide enough to accommodate the die 360. In general, the bottom most metallic layer 338 in the substrate structure 320 also includes a ground plate 339 to serve as an electrical ground. Furthermore, the substrate 320 also has two solder mask layers 352, 354 on the first surface 322 and the second surface 324 respectively. The solder mask layer 354 has a plurality of openings 356 that expose a portion of the uppermost metallic layer 332. The exposed metallic layer 332 forms a set of contact pads 330, 333. The contact pad 333 is located close to the edge of the through hole 328. The solder mask layer 352 also has a plurality of openings 358 that exposes a portion of the bottom most metallic layer 338. The exposed metallic layer 338 forms a plurality of contact pads 337. The contact pads 337 may connect with the ground plate 338 electrically. The conductive glue 392 fills the openings 358 and connects with the contact pad 337 electrically. Through the conductive glue 392, the substrate 320 and the heat spreader 310 are electrically connected. The substrate 320, the conductive glue 392 and the heat spreader 310 together constitute a carrier 302 for supporting the die 360. The die 360 is electrically connected to an external circuit (not shown) through the carrier 302. Moreover, the substrate 320 is fastened to the heat spreader 310 using conductive glue 392 so that the substrate 320 and the heat spreader 310 are also electrically connected. In other words, the substrate 320 is built up from a series of metallic circuit structures 321 and a series of dielectric structures 323. The metallic circuit structures 321 alternates between the dielectric structures 323. The metallic circuit structures actually are comprised of the metallic layers 332, 334, 336, 338 and the metallic layer 331 within the through hole 326 and the dielectric structures 323 actually are comprised of the dielectric layers 342, 344, 346 and the solder mask layers 352, 354.

The die 360 has an active surface 362 and a back surface 364. The active surface 362 of the die 360 has a plurality of bonding pads 366 thereon. The back surface 364 is attached to the first surface 312 of the heat spreader 310 through an adhesion layer 394. One end of each conductive wire 370 is bonded to the bonding pad 366 while the other end of the conductive wire 370 is bonded to the contact pad 333 of the substrate 320. The encapsulation 380 fills up the leftover space of the through hole 328 and encloses the die 360, the conductive wires 370 and the contact pads 333. The solder balls 390 are attached to the contact pads on the substrate 320. Through the solder balls 390, the substrate 320 is electrically connected to an external circuit.

In the aforementioned cavity down ball grid array package 300, the heat spreader 310 and the contact pad 337 are electrically connected. Hence, the heat spreader 310 may serve as a grounding plate. Since the heat spreader 310 has a surface area much larger than the combined area of the die 360 and the substrate 320, the number of noise sources is greatly reduced. The effect of noise reduction is particularly evident in radio frequency electronic packages.

In addition, the die 360 is attached to the heat spreader 310 through the adhesion layer 394. Heat generated by the die 360 can be rapidly conducted away through the heat spreader 310. Hence, the cavity down ball grid array package 300 has a high heat dissipating capacity.

Note that the application of the heat spreader 310 is not limited to serving as an electrical ground. The heat spreader 310 may connect electrically with a power source terminal to serve as a power surface.

Generally, for example, the substrate 320 can include a first ground terminal. The heat spreader 310 and the first ground terminal are electrically connected together through the conductive glue fills. In addition, the die may also include a second ground terminal, as well as the heat spreader 310 and the second ground terminal are electrically connected together through the conductive glue fills.

Alternatively, the surface of the substrate can be attached to the heat spreader through conductive glue with the substrate comprising alternately positioned metallic circuit structures and dielectric structures. The dielectric structures has at least an opening that exposes one of the metallic circuit structures, and the conductive glue fills the opening and connects with the metallic circuit structures electrically.

Also and, the first surface of the substrate can be attached to the heat spreader through conductive glue with the substrate comprising alternately positioned metallic circuit structures and dielectric structures. The dielectric structure attached to the heat spreader has at least an opening that exposes one of the metallic circuit structures, and the conductive glue fills the opening and connects with the metallic circuit structures electrically.

In conclusion, major advantages of this invention include: 1. The heat spreader is capable of connecting electrically with the substrate to serve as an electrical ground. Since the heat spreader has a surface area much greater than the combined area of the die and the substrate, the number of noise sources is greatly reduced. 2. Since the back surface of the die is directly attached to the heat spreader through an adhesion layer, heat generated by the die is able to conduct away through the heat spreader leading to an increase in heat dissipation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cavity down ball grid array package, comprising:
    a heat spreader;
    a substrate having a first surface and a second surface, wherein the first surface of the substrate is attached to the heat spreader through a conductive glue, in addition, the substrate has a through hole that passes through the substrate and exposes the heat spreader, and the substrate and the heat spreader are electrically connected, wherein the substrate comprises alternately positioned metallic circuit structures and dielectric structures, and wherein the dielectric structures include at least an opening that exposes one of metallic circuit structures, and the conductive glue fills the opening and electrically connects the metallic circuit structure and the heat spreader;
    a die having an active surface and a back surface, wherein the die has a plurality of bonding pads on the active surface of the die and the back surface of the die is attached to the heat spreader inside the through hole;
    a plurality of conductive wire, wherein one end of each conductive wire is electrically connected to a bonding pad and the other end of the conductive wire is electrically connected to the substrate; and
    an encapsulation filling the through hole and enclosing the die and the conductive wires.

2. The package of claim 1, wherein the opening penetrates through the dielectric structure attached to the heat spreader and exposes the metallic circuit structures closest to the heat spreader, and wherein the conductive glue fills the opening and connects the metallic circuit structure closest to the heat spreader and the heat spreader electrically.

3. The package of claim 1, wherein the metallic circuit structures of the substrate are electrically connected.

4. The package of claim 1, wherein a material forming the heat spreader includes copper.

5. The package of claim 1, wherein the heat spreader has a metallic layer thereon and a material forming the metallic layer includes nickel.

6. The package of claim 1, wherein the substrate further includes a first ground terminal and the heat spreader and the first ground terminal are electrically connected through the conductive glue fills.

7. The package of claim 1, wherein the die further includes a second ground terminal and the heat spreader and the second ground terminal are electrically connected through the conductive glue fills.

8. The package of claim 1, wherein further includes a plurality of solder balls formed on the second surface of the substrate.

9. A carrier, comprising:
    a heat spreader; and
    a substrate attached to the heat spreader through a conductive glue such that the substrate and the heat spreader are electrically connected, wherein the substrate comprises alternately positioned metallic circuit structures and dielectric structures, and wherein the dielectric structures include at least an opening that one of the metallic circuit structures, and the conductive glue fills the opening and electrically connects the metallic circuit structure and the heat spreader.

10. The package of claim 9, wherein the opening penetrates through the dielectric structure attached to the heat spreader and exposes the metallic circuit structure closest to the heat spreader, and wherein the conductive glue fills the opening and connects with the metallic circuit structure closest to the heat spreader and the heat spreader electrically.

11. The package of claim 9, wherein the metallic circuit structures of the substrate are electrically connected.

12. The carrier of claim 9, wherein a material forming the heat spreader includes copper.

13. The carrier of claim 9, wherein the heat spreader has a metallic layer thereon and a material forming the metallic layer includes nickel.

14. The carrier of claim 9, wherein the substrate further includes a first ground terminal, and the heat spreader and the first ground terminal are electrically connected through the conductive glue fills.

* * * * *